United States Patent [19]

Cocivera

[11] Patent Number: 4,536,260

[45] Date of Patent: Aug. 20, 1985

[54] THIN FILM CADMIUM SELENIDE ELECTRODEPOSITED FROM SELENOSULPHITE SOLUTION

[75] Inventor: Michael Cocivera, Guelph, Canada

[73] Assignee: University of Guelph, Guelph, Canada

[21] Appl. No.: 609,971

[22] Filed: May 14, 1984

[51] Int. Cl.$^3$ ............................ C25D 5/50; C25D 9/08
[52] U.S. Cl. .................................. 204/37.1; 136/260; 204/56 R; 429/111
[58] Field of Search ...................... 204/56 R, 86, 43.1, 204/123, 2.1, 37.1, 29; 136/260; 429/111

[56] References Cited

U.S. PATENT DOCUMENTS

| | | | |
|---|---|---|---|
| 2,377,228 | 5/1945 | Harford | 204/50.1 |
| 4,253,919 | 3/1981 | Hall et al. | 204/37.1 |
| 4,256,544 | 3/1981 | Kazacos et al. | 204/2.1 |

OTHER PUBLICATIONS

Maria Skyllas-Kazacos, J. Electroanal. Chem., 148, pp. 233–239, (1983).

R. A. Boudreau et al., Solar Energy Materials, 7, pp. 385–391, (1982).

M. Skyllas-Kazacos et al., J. Electrochem. Soc., 127, pp. 869–873, Apr. 1980; pp. 2378–2381, Nov. 1980.

Harold Narcus, Metal Finishing, pp. 54–61, Mar. 1952.

*Primary Examiner*—G. L. Kaplan
*Attorney, Agent, or Firm*—Sim & McBurney

[57] ABSTRACT

A process for electrodepositing a thin layer of cadmium selenide on a suitable substrate is disclosed. The substrate is immersed in an electrolyte bath with pH ranging from 5 to 10 and having an aqueous solution of selenosulphite ions and cadmium ions complexed with nitrilotriacetic acid. The pH range shifts the chemical equilibrium of complexing the cadmium ions towards associated complexed cadmium ions. A voltage is applied to the cathode and anode in the electrolyte to reduce the selenosulphite ions to produce selenide ions at the cathode of a sufficient concentration which reacts with the complexed cadmium ions to electrodeposit thereby cadmium selenide on the cathode. The thin layer of cadmium selenide is particularly useful in a photoelectrochemical cell.

15 Claims, 2 Drawing Figures

THIN FILM CADMIUM SELENIDE ELECTRODEPOSITED FROM SELENOSULPHITE SOLUTION

FIELD OF THE INVENTION

This invention relates to electrodeposited thin film of cadmium selenide which has semi-conductor properties and is particularly useful in the photo conversion of light into electrical power.

BACKGROUND OF THE INVENTION

Thin films of codeposited cadmium/selenium for solar cells have been prepared by means of electrodeposition from aqueous solutions containing cadmium ions and selenious acid. U.S. Pat. No. 4,253,919 discloses this technique where hydrated citric acid is used to facilitate the codeposition of selenium and cadmium on the substrate. It was found that the use of citrate baths avoided the need of complexing agents to retard deposition of the more easily deposited species of the cadmium/selenium elements. Further example of this technique of electrodepositing the thin film of cadmium selenide from aqueous solutions containing cadmium ions and selenious acid is disclosed in M. Skyllas-Kayacos and B. Miller, *J. Electrochem. Soc.* 127, 869 (1980) and M. Tomkiewicz, I. Ling and W. S. Parsons, *J. Electrochem. Soc.* 129, 2016.

The difficulty in electrodepositing thin films of cadmium/selenium from the solutions containing selenious acid is that a substantial excess of selenium is detected in the films. To remove a major portion of this excess, the films must be annealed at temperatures as high as 750° C. It is thought that the selenium incorporation occurs according to the reaction

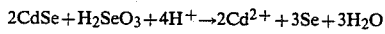

$$2CdSe + H_2SeO_3 + 4H^+ \rightarrow 2Cd^{2+} + 3Se + 3H_2O$$

It was, therefore, important to avoid having this reaction occur in the electrolyte bath.

The selenosulphite ion has been employed in forming cadmium selenide films by a chemical deposition process as disclosed in R. A. Boudreau and R. D. Rauh, *J. Electrochem. Soc.* 130, 513 (1983). The process involves the precipitation of cadmium selenide from a solution at 90° C. containing a cadmium-amine complex and sodium selenosulphite. This proves to be complicated, difficult to control and non-specific regarding the areas of deposition.

An alternate approach to the electrodeposition of cadmium selenide involves the use of cyanide solutions as disclosed in M. Skyllas-Kazacos, *J. Electroanal. Chem.* 148, 233, (1983). The cadmium ions are complexed with EDTA and a selenocyanide ion is incorporated in the solution which is reduced at the cathode to produce selenide ions which react with the cadmium ions to electrodeposit cadmium selenide on the cathode. However, the solar energy conversion efficiencies of films produced by this process are low.

The process, according to this invention, is capable of electrodepositing relatively large surface area thin films of cadmium selenide at room temperature without any requirement to control the atmosphere about the system.

SUMMARY OF THE INVENTION

The thin film cadmium selenide on a substrate is electrodeposited according to this invention by reduction of an aqueous solution containing the selenosulphite ion and a cadmium ion complexed with nitrilotriacetic acid. The process comprises immersing a cathode of a suitable electrically conductive substrate in association with an anode in an electrolyte bath which is weakly acidic to basic and having an aqueous solution of selenosulphite ions and cadmium ions complexed with a complexing agent. The pH range for the bath shifts the chemical equilibrium of complexing the cadmium ions towards associated complexed cadmium ions. A voltage is applied across the cathode and anode to reduce the selenosulphite ions to produce selenide ions at the cathode of a sufficient concentration which reacts with the complexed cadmium ions to electrodeposit thereby cadmium selenide on the cathode surface.

According to another aspect of the invention, a thin film cadmium selenide electrodeposited in accordance with this process provides a structurally stable film ranging in thickness from 1 to 2 micrometers and having a cadmium ion to selenide ion ratio of approximately 1:1. The film has a surface area of at least 1 cm$^2$ giving a photoconversion efficiency in excess of 5.5% when used in a photoelectrochemical cell.

BRIEF DESCRIPTION OF THE DRAWINGS

Experimental results in testing the photoconversion efficiencies of the thin film cadmium selenide made according to a preferred embodiment of this invention are exemplified in the drawings, wherein.

DETAILED DESCRIPTION OF THE PREFERRED EMBODIMENTS

Figure 1:
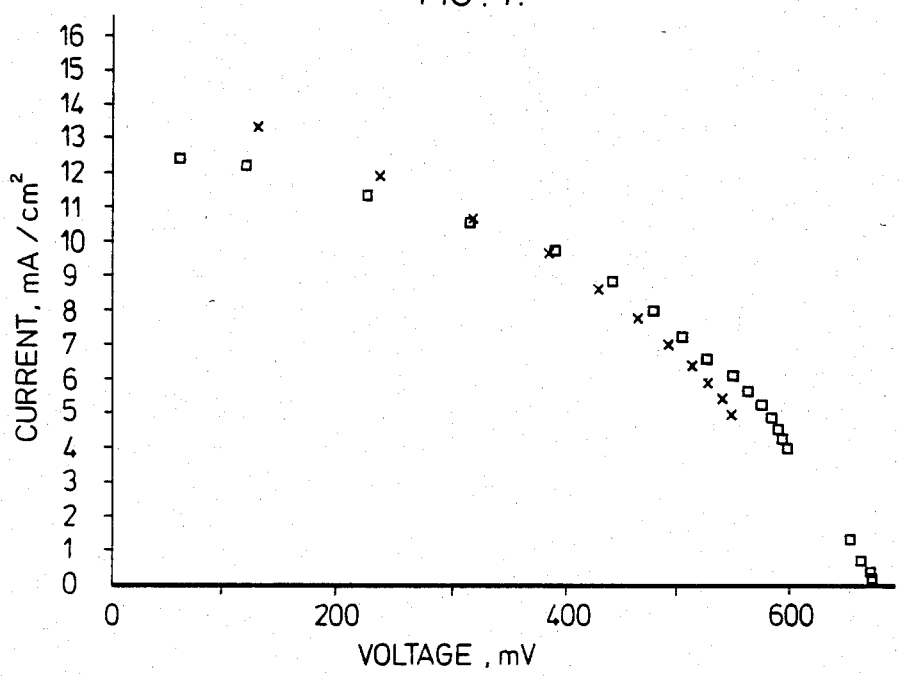
FIG. 1 illustrates the photocurrent/photovoltage characteristics of cadmium selenide films of this invention.

The process, according to this invention, is capable of forming thin film cadmium selenide by electrochemical reduction without the requirement of controlling the atmosphere. The process is preferably conducted at room temperature; however, it may also be carried out at temperatures above room temperature. The cadmium selenide is electrodeposited from an electrolyte containing a selenium precursor in the lower valence form of a selenosulphite ion. To control adverse reactions in the electrolyte, the cadmium ions are complexed with a complexing agent so as to provide a pool of cadmium ions which are disassociated from the complex at the cathode surface to associate with the formed selenide ions to deposit cadmium selenide on the surface of the cathode.

The electrolyte solution is weakly acidic to basic rather than strongly acidic compared to prior art processes. According to an embodiment of this invention, the pH of the electrolyte is in the range of 5 to 10. It has been found that with the electrolyte, according to aspects of this invention, a much lower current density is required in electrodepositing the cadmium selenide on the surface of the cathode. A distinct advantage of this process in using the electrolytes according to this invention, provides larger surface area of electrodeposited cadmium selenide films preferably in excess of 1 cm$^2$, where it has been found that the morphology of the film is different from films previously either electrodeposited or chemically deposited on substrates. The quality of the films of this invention are superior to those of prior art processes. Because there is no reaction in the electrolyte when current is not passing through the solution, the electrolyte solution can be used many times in electrodepositing cadmium selenide on the cathodes.

According to a preferred embodiment of the invention, the thin film cadmium selenide is deposited on any suitable conductive cathode, such as titanium, cadmium, molybdenum, platinum, indium tin oxide coated glass, stainless steel, nickel, carbon and gold. It is appreciated that other substrates may be used where the main criteria in selection is that the selected substrate does not react with the electrolyte. The thin film is deposited at room temperature in a non-controlled atmosphere using a two electrode cell in which the anode may be of cadmium metal to supply additional cadmium ions during the electrodeposition process. By applying a constant current density or potential to the electrodes, a thin film of cadmium selenide is deposited on the cathode. The constant current density may range from 0.25 to 1 milliamp/cm$^2$. The preferred thicknesses are in the range of 1 to 2 micrometers. However up to 10 micrometers has been electrodeposited by this method.

The selenide ion is provided in the electrolyte solution by reduction of the seleno ion at the cathode. The seleno precursor is provided in the electrolyte by the ion selenosulphite ($SeSO_3^{-2}$). Preferably the selenosulphite ions are prepared by dissolving elemental selenium powder in an aqueous solution of sodium sulphite. The seleno precursor is reduced at the cathode to form selenide which is at a sufficiently high concentration to become associated with cadmium ions as dissociated from the complexed pool of cadmium ions to form the cadmium selenide which deposits on the cathode.

To avoid adverse reactions in the electrolyte, the cadmium ions as introduced from the anode into the electrolyte are complexed with a complexing agent. The electrolyte is at a pH in the range weakly acidic to weakly basic. The weakly acidic range is from 5 to 7 and the weakly basic range is from 7 to 10 which equates to an overall pH range of 7 to 10 which shifts the chemical equilibrium of complexing the cadmium ions towards the associated complexed cadmium ions. This minimizes the competitive reactions of cadmium ions with hydroxide ions in the electrolyte and with any selenide ions which may be free in the solution. The selenide ion can be produced in the electrolyte by the reaction of selenosulphite with hydroxide ions to produce selenide and sulphate ions. However, the pH usually does not exceed 10 so that the hydroxyl ion concentration is such that the equilibrium involving the selenosulphite and hydroxide favours the selenosulphite ion as compared to the production of selenide when the cadmium ions exist in the solution complexed by the complexing agent.

It is appreciated that many complexing agents may be used to minimize the cadmium ion concentration in the solution. According to the improvement of this invention, the selected complexing agent is nitrilotriacetic acid.

The complexed cadmium ion may be prepared in an aqueous solution by dissolving a cadmium salt such as cadmium chloride hydrate ($CdCl_2.2.5\ H_2O$) with a salt of nitrilotriacetic acid at a pH in the range of 5 to 10.

The selenosulphite solution and the complexed cadmium ion solution are mixed and found to be stable. The solution remains clear and colourless over extended periods which indicates that at the pH range of 5 to 10, the cadmium ions are sufficiently complexed to minimize or prevent production of cadmium selenide by non-electrochemical processes.

After the desired thickness of the cadmium selenide film has been electrodeposited on the cathode, it is removed from the electrolyte and annealed at temperatures which are preferably in the range of 500° to 550° C. After the annealing step, the surface is further treated for photoelectrochemical conversion purposes. Testing of the efficiencies of the thin film cadmium selenide as used in the photoelectrochemical cell provided photoconversion efficiencies in the range of 5.5 to 6.0%.

The following Examples, according to preferred embodiments of the invention, demonstrate the features thereof. However, it is understood that such Examples are not to be interpreted as limiting the scope of the invention as defined in the claims.

EXAMPLE 1

A thin film cadmium selenide is deposited at a titanium cathode at room temperature using a two electrode cell in which the anode is cadmium metal. A constant potential of 0.30 volts between these electrodes was maintained using a Bioanalytical System (BAS) CVIB. Under these conditions, there was an initial transient reduction current that decayed to near zero in about 10 seconds. Current density then gradually increased to 0.34 mA/cm$^2$ over a period of approximately 100 seconds and continued to increase gradually to 0.47 mA/cm$^2$ over a period of 15 minutes. By including a saturated calomel electrode (SCE) in the cell, the titanium electrode potential was $-1.07$ volts vs SCE. The electrodeposition was preformed at a pH 9 at room temperature using an air saturated solution. The anode was not isolated from the cathode. Magnetic stirring was maintained during deposition.

The air saturated electrolytic solution contained 0.02 M selenosulphite anion and 0.02 M cadmium cation complexed with the nitrilotriacetate anion. The electrodeposition was performed for approximately one hour at room temperature and pH 9 to provide a film thickness of approximately 1.3 to 1.6 micrometers. The selenosulphite and complex cadmium ion solutions were prepared by dissolving 0.120 grams of elemental selenium powder (0.050 M) in an aqueous solution containing 3.0 grams of sodium sulphite (0.75 M) at pH 9. The cadmium solution was prepared by dissolving 0.20 grams of $CdCl_2.2H_2O$ (0.088 M) into an aqueous solution containing 0.103 M sodium nitrilotriacetate at pH 8. The cadmium complex having a stability constant of $10^{9.8}$ reduces the concentration of free cadmium ion to avoid the chemical reaction of:

$$Cd^{2+} + 2OH^- + SeSO^{2-} \rightarrow CdSe + SO^{2-} + H_2O$$

which could occur to an appreciable extent. By means of this complex, the solution remains stable for at least 24 hours. Control experiments indicated that this chemical reaction provides no detectable cadmium selenide film on the titanium during the electrolysis.

The films prepared by this method provided the best light power to electrical power conversion efficiencies of 5.5 to 5.9%. This method provided consistent quality films from one solution to the next. Five solutions were used in accordance with this method to give films having the above efficiencies. The solutions were sufficiently stable so that electrodepositions were repeated several times. The solutions were left over 24 hour periods without any special provisions taken. None or little cadmium selenide was deposited out in the solutions and when subsequently used provided films for cadmium selenide having photoconversion efficiencies as good as those obtained from fresh solutions.

The film on the titanium cathode appeared dark gray with a slight sheen and adhered well to the titanium. Analysis by various techniques indicated a ratio of cadmium ion to selenide ion of approximately 1:1. More particularly, polargraphic analysis indicated that the ratio of cadmium ion to selenide ion was 1.2 in the film. Rutherford back scattering spectroscopy indicated a ratio of 1.1. Based on the composition of the film, comparisons of the weight of the films with the number of coulombs passed indicated that the efficiency of the electrodeposition process was approximately 88%.

The films as deposited were annealed at 500° to 550° C. for approximately ½ hour. The annealing at these temperatures provided suitable activation without substantial loss of material due to vapourization. After annealing, the surface of the film was prepared by etching with 9 N HCl, soaking in 1N NaCN and treatment with 1M $ZnCl_2$.

The thickness of the film was determined in accordance with conventional practice, such as the Sloan Dektak stylus type technique.

EXAMPLE 2

The efficiency for the conversion of light power into electrical power of the 1 $cm^2$ cadmium selenide films of Example 1 were tested. Although the thin film cadmium selenides may be used in photovoltaic cells, the efficiency of the films were tested in photoelectrochemical cells that contained an aqueous solution of $Na_2S/S/NaOH$ in the molar ratio of 1/1/1/. In this cell, the cadmium selenide film photoanode was connected by a variable resistor to the counter electrode, which consisted of brass mesh coated with $Cu_2S$. No external biasing was applied. The photovoltage across the resistor was measured using a digital voltmeter. Unfiltered light from a Quartzline ELH lamp was used for excitation. The photovoltages measured in this manner for the film is quite stable with no appreciable variation during the radiation for periods up to 15 minutes. Dark voltages were negligible at all loads below 1 $K\Omega$. Above 1 $K\Omega$, the dark voltage increased with resistance to a maximum value around 50 mV at open circuit. As shown in FIG. 1, two thicknesses were tested. The first thickness, as shown with the square dots, was 1.3 micrometers and the second thickness was 2.6 micrometers as shown by X's. There is little difference between the results for the two thicknesses. For the CdSe films of 1 $cm^2$ area, the conversion of light power to electrical power was calculated to be in the range of 5.74±0.09% for 70 milliwatt insolation. The open circuit voltages at 70 mW was typically between 600 and 700 mV. Short circuit current density at 70 mW insolation was in the range of 12.4 to 14.4 mA per $cm^2$ and fill factors were in the range of 0.40 to 0.47.

EXAMPLE 3

Figure 2:
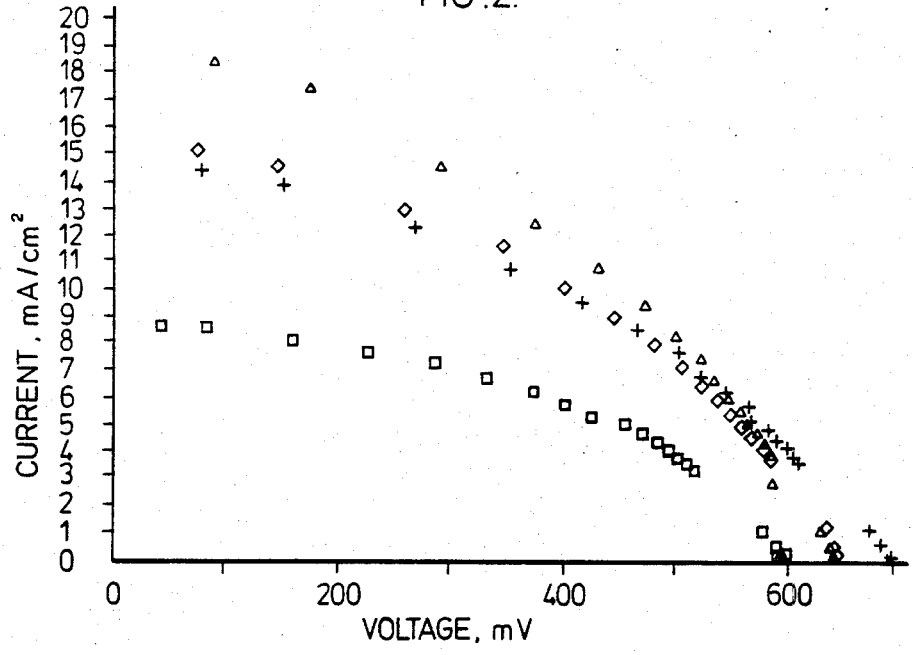
FIG. 2 illustrates the photo response of cadmium selenide films of this invention as a function of light power.

FIG. 2 illustrates the photo response, as a function of the light power, of the 1 $cm^2$ cadmium selenide film of Example 1 having a 1.3 micrometer thickness. The conversion efficiency decreases somewhat as the light intensity increases. The response to the 40 mW insolation is represented by (□); 70 mW insolation by (+); 80 mW insolation by (◇) and 100 mW insolation by (△). The conversion efficiencies for the 40, 70, 80 and 100 mW insolation are respectively as follows: 5.9, 5.9, 5.1 and 4.7%. When a different film having a surface area of 3.2 $cm^2$ was tested, the comparable efficiencies for 70 mW insolation were realized.

The thin film cadmium selenide as electrodeposited by this invention, results in large surface area films of consistent characteristics with relatively high solar conversion efficiencies. The films may be used in power plants, energy for homes, preparations of chemicals and other areas where photoconversion devices are useful. The method, according to this invention, provides a procedure for electrodepositing increased surface areas of cadmium selenide film in an efficient economic manner with a minimum of process control.

Although various preferred embodiments of the invention have been described herein in detail, it will be understood by those skilled in the art that variations may be made thereto without departing from the spirit of the invention or the scope of the appended claims.

The embodiments of the invention in which an exclusive property or privilege is claimed are defined as follows:

1. In a process for electrodepositing a thin layer of cadmium selenide on a suitable electrically conductive substrate comprising immersing a cathode of said substrate in association with an anode in an electrolyte bath having a pH ranging from 5 to 10 and having an aqueous solution of selenosulphite ions and cadmium ions complexed with a complexing agent where said pH range shifts the chemical equilibrium of complexing said cadmium ions towards associated complexed cadmium ions, applying a voltage across said cathode and anode to reduce said selenosulphite ions to produce selenide ions at said cathode of a sufficient concentration which reacts with the complexed cadmium ions to electrodeposit thereby cadmium selenide on said cathode and annealing said electrodeposited cadmium selenide, the improvement comprising the use of nitrilotriacetic acid as said complexing agent.

2. A process of claim 1 wherein said electrolyte bath is operated at room temperature.

3. A process of claim 1 wherein said cadmium selenide is electrodeposited to a thickness of approximately 1 to 2 micrometers on said substrate.

4. A process of claim 3 wherein said annealing temperatures are in the range of 500° C. to 550° C.

5. A process of claim 1 wherein said cathode substrate is selected from the group consisting of titanium, cadmium, molybdenum, platinum, indium, tin oxide coated glass, stainless steel, nickel, carbon and gold.

6. A process of claim 5 wherein said cathodic substrate is titanium and said anode is elemental cadmium.

7. A process of claim 6 further comprising treating the surface of said titanium cathode to enhance electrodeposition of cadmium selenide onto said cathode.

8. A process of claim 1 wherein an essentially constant potential of approximately 0.30 volts is applied to said cathode and anode.

9. A process of claim 1 wherein an essentially constant current density is applied on the cathode which is selected from the range of 0.25 to 1.0 milliamp/$cm^2$.

10. A process of claim 1 wherein said complexed cadmium is stable in an aqueous solution for a period of up to approximately 24 hours.

11. A process of claim 1 wherein said cadmium selenide is electrodeposited on a cathode substrate having a surface area of at least 1 cm$^2$.

12. A process of claim 1 further comprising preparing a solution containing said selenosulphite ions separately of a solution of said complexed cadmium ions and mixing the two solutions to form said electrolyte bath which is adjusted to a pH in the range of 5 to 10.

13. A process of claim 12 wherein said solution of selenosulphite is prepared by dissolving elemental selenium in an aqueous solution of a sulphite.

14. A process of claim 12 or 13 wherein said solution of complexed cadmium ions is prepared by dissolving a cadmium salt in an aqueous solution of a nitriliotriacetate.

15. A process of claim 1, wherein said pH for said electrolyte bath is weakly basic which is in the range of 7 to 10.

* * * * *